(12) United States Patent
Pourquier

(10) Patent No.: US 10,797,200 B2
(45) Date of Patent: Oct. 6, 2020

(54) METHOD FOR PRODUCING AN OPTOELECTRONIC DEVICE COMPRISING A STEP OF ETCHING THE REAR FACE OF THE GROWTH SUBSTRATE

(71) Applicant: ALEDIA, Grenoble (FR)

(72) Inventor: Eric Pourquier, Grenoble (FR)

(73) Assignee: ALEDIA, Grenoble (FR)

( * ) Notice: Subject to any disclaimer, the term of this patent is extended or adjusted under 35 U.S.C. 154(b) by 0 days.

(21) Appl. No.: 16/473,665

(22) PCT Filed: Dec. 22, 2017

(86) PCT No.: PCT/FR2017/053817
§ 371 (c)(1),
(2) Date: Jun. 26, 2019

(87) PCT Pub. No.: WO2018/122517
PCT Pub. Date: Jul. 5, 2018

(65) Prior Publication Data
US 2019/0348566 A1  Nov. 14, 2019

(30) Foreign Application Priority Data

Dec. 27, 2016 (FR) ...................... 16 63409

(51) Int. Cl.
*H01L 33/00* (2010.01)
*H01L 33/24* (2010.01)
(52) U.S. Cl.
CPC ........ *H01L 33/0093* (2020.05); *H01L 33/007* (2013.01); *H01L 33/24* (2013.01)

(58) Field of Classification Search
CPC ... H01L 33/007; H01L 33/0093; H01L 33/24; H01S 5/0217
See application file for complete search history.

(56) References Cited

U.S. PATENT DOCUMENTS

| | | | |
|---|---|---|---|
| 8,779,456 B2* | 7/2014 | Mastro | H01L 33/40 257/98 |
| 9,076,941 B2* | 7/2015 | Herrmann | H01L 33/44 |
| 9,799,801 B2* | 10/2017 | Schmid | H01L 33/24 |
| 10,249,786 B2* | 4/2019 | Batres | H01S 5/183 |
| 2005/0176192 A1 | 8/2005 | Hshieh | |
| 2012/0205614 A1 | 8/2012 | Templier et al. | |
| 2013/0052805 A1 | 2/2013 | Previtali | |
| 2015/0008456 A1 | 1/2015 | Lagrange et al. | |
| 2015/0155331 A1 | 6/2015 | Guenard | |

FOREIGN PATENT DOCUMENTS

| | | |
|---|---|---|
| JP | 2015199650 | 11/2015 |
| WO | WO 2011/048318 | 4/2011 |
| WO | WO 2018/122517 | 7/2018 |

\* cited by examiner

*Primary Examiner* — William Coleman
(74) *Attorney, Agent, or Firm* — Occhiuti & Rohlicek LLP

(57) ABSTRACT

The invention relates to a method for manufacturing an optoelectronic device (1), comprising the following steps: a) providing a growth substrate (10) made from a semiconductor material; b) forming a plurality of diodes (20) each comprising a lower face (20i); c) removing at least a portion (12; 13) of the substrate so as to free the lower face (20i); wherein: step a) involves producing a lower part and an upper part of the substrate, the upper part (12) having a uniform thickness ($e_{ref}$) and a level of doping less than that of the lower part; step c) involving removal of the lower part (11) by selective chemical etching with respect to the upper part (12).

20 Claims, 8 Drawing Sheets

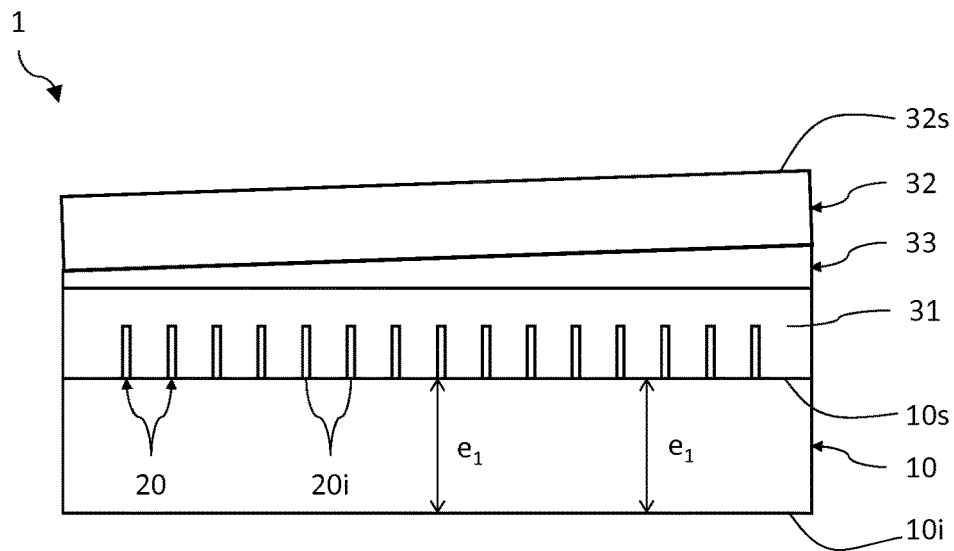
Fig.1A
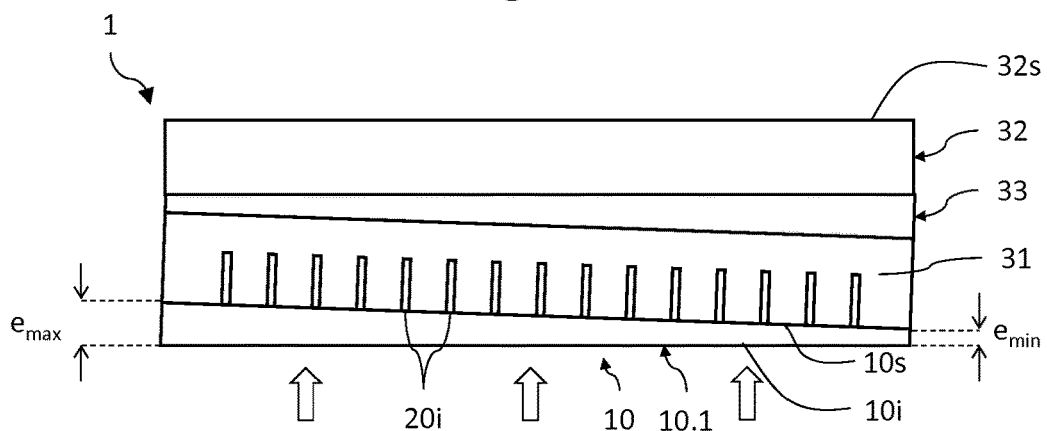
Fig.1B
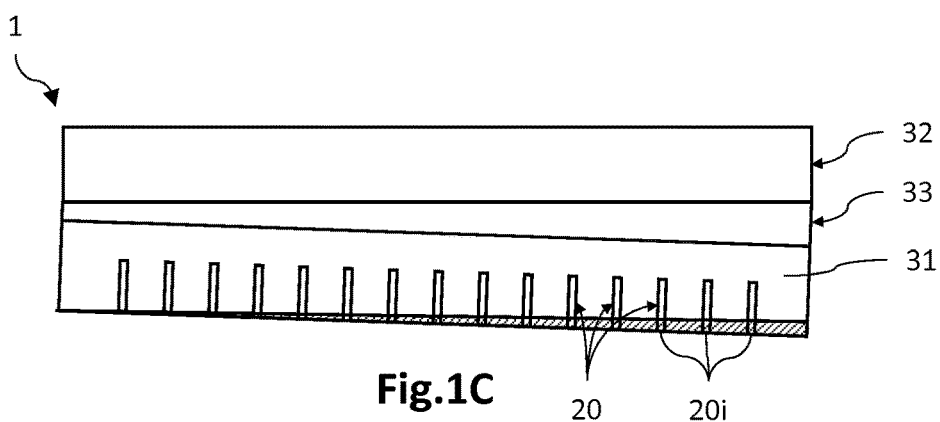
Fig.1C
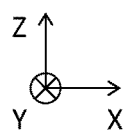

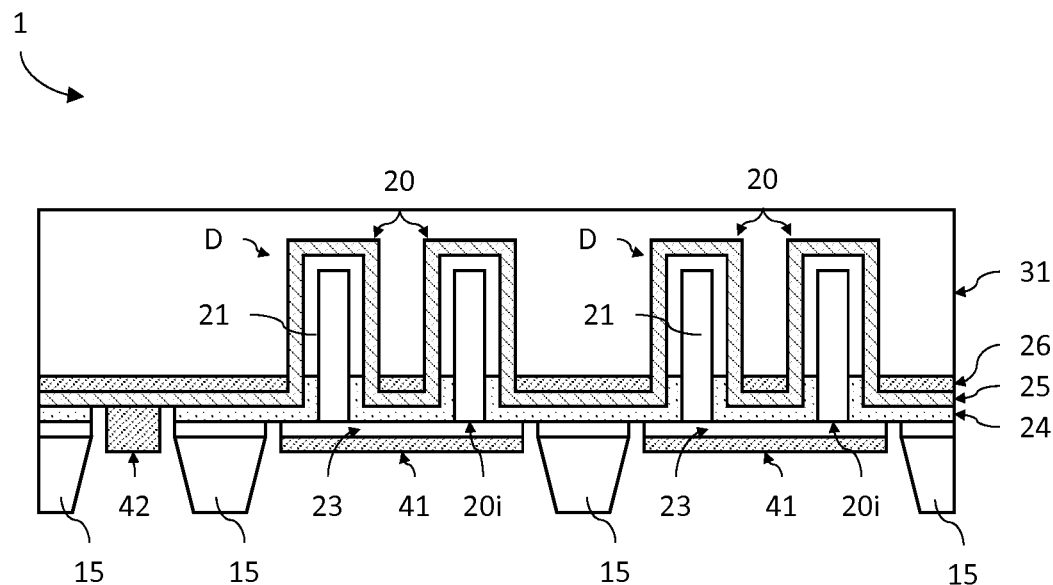
Fig.6A
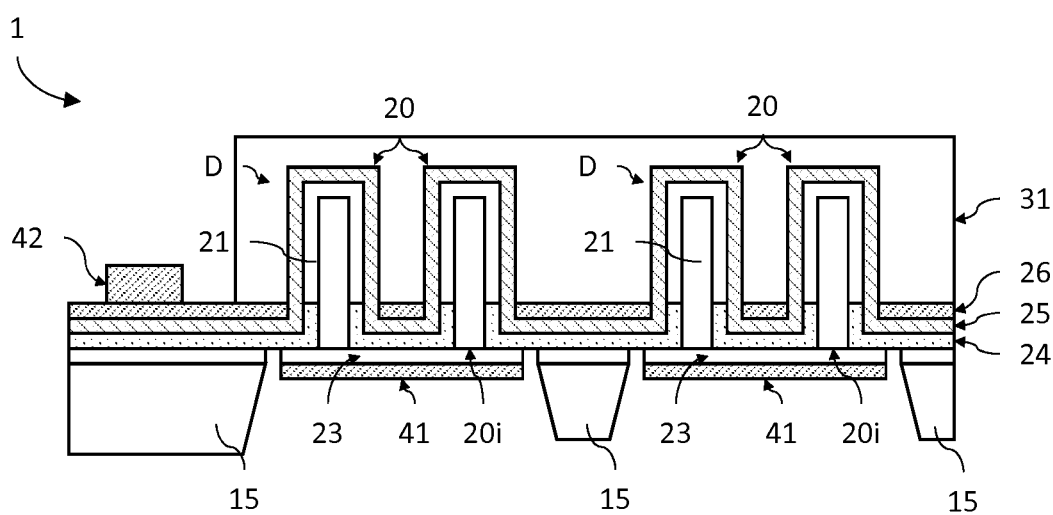
Fig.6B
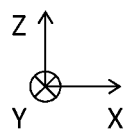

METHOD FOR PRODUCING AN OPTOELECTRONIC DEVICE COMPRISING A STEP OF ETCHING THE REAR FACE OF THE GROWTH SUBSTRATE

CROSS REFERENCE TO RELATED APPLICATIONS

This application is a National Stage of International Application No. PCT/FR2017/053817 filed on Dec. 22, 2017, which claims priority to French Application No. 1663409 filed on Dec. 27, 2016, the contents of which are hereby incorporated by reference in their entirety.

TECHNICAL FIELD

The field of the invention is that of methods for fabricating an optoelectronic device with light-emitting diodes or with photodiodes. The invention applies in particular to the field of devices with a matrix of light-emitting diodes such as display screens and image projectors, as well as to that of devices with a matrix of photodiodes such as photodetectors and image sensors.

PRIOR ART

The methods for fabricating optoelectronic devices with light-emitting diodes may comprise a step of complete or partial removal of the growth substrate from which the diodes were formed. This is notably the case when we wish to perform pixelization of the light-emitting diodes for making a display screen or an image projector.

The light-emitting diodes of an optoelectronic device of this kind may each comprise a three-dimensional semiconducting element, for example a wire, which forms a first doped portion, a part of which is covered by an active zone that may comprise at least one quantum well, and by a second doped portion, the first and the second doped portions forming a p-n junction.

Thus, document WO2011/48318 describes an example of a method for fabricating an optoelectronic device with wire light-emitting diodes, for the purpose of obtaining an emitting screen. This method notably comprises supplying a growth substrate, forming a plurality of light-emitting diodes starting from the growth substrate, and then removal, in this case total, of the growth substrate after assembling the free end of the light-emitting diodes with an active matrix. The growth substrate may be removed by chemical etching or by erosion.

However, it appears that removing the substrate as described in this document is likely to lead to structural degradation of at least part of the optoelectronic device.

DISCLOSURE OF THE INVENTION

The aim of the invention is to remedy the drawbacks of the prior art, at least partly, and more particularly it proposes a method for fabricating an optoelectronic device, comprising the following steps:
a) supplying a so-called growth substrate made of a semiconductor material, comprising a front face and a rear face opposite one another;
b) forming, on the front face, a plurality of diodes, each diode comprising a lower face resting on the substrate;
c) removing, from the rear face, at least a portion of the substrate so as to free the lower face of at least a part of the diodes, the portion removed being initially located opposite said part of diodes;
in which:
step a) comprises producing a lower part and an upper part of the substrate each extending opposite the diodes, said parts being doped with one and the same type of conductivity, the lower part having a first doping level, and the upper part having a second doping level lower than the first level and extending from the front face to the lower part with a uniform thickness;
step c) comprising removing the lower part by selective chemical etching with respect to the upper part.

Certain preferred but nonlimiting aspects of this method of fabrication are as follows.

Step c) may further comprise complete or partial removal of the upper part of the substrate by chemical etching, in a plane parallel to the front face, so as to free the lower face of the diodes.

Each diode may comprise a semiconducting element which participates in formation of a p-n junction of the diode, the lower face of each diode being in electrical contact with said semiconducting element. The method of fabrication may comprise a step d) of forming at least one first conductive stud in contact with the lower face of said part of the diodes.

In step b), the diodes may be distributed spatially as a plurality of separate assemblies of diodes, each assembly being intended to form a pixel of the optoelectronic device.

In step d), a plurality of separate first conductive studs may be formed, each first conductive stud being in contact with the lower face of the diodes of one and the same assembly.

The upper part may comprise so-called central portions separated from one another, in a plane parallel to the front face, by so-called lateral portions, each central portion being located opposite an assembly of diodes and the lateral portions being located between the assemblies of diodes.

Step c) may comprise partial removal of the upper part, in a plane parallel to the front face, so as to remove the central portions and preserve the lateral portions, which thus form lateral retaining walls.

In step c), the central portions may be etched by wet or dry etching.

Step a) may comprise producing said central portions by localized doping of the upper part in such a way that said central portions have a doping level greater than or equal to the first doping level and so that the lateral portions have the second doping level, each central portion being separated from the adjacent central portions by one of said lateral portions, and each central portion having a thickness strictly less than the thickness of the upper part.

Step c) may comprise, following removal of the lower part, a step of thinning the substrate so that the rear face opens onto the central portions, and then removal of the central portions by selective chemical etching with respect to the lateral portions, so as to free the lower face of the assemblies of diodes, the lateral portions thus forming lateral retaining walls.

Said thickness of the upper part may be between 0.5 µm and 20 µm, so that, at the end of step c), the lateral retaining walls have a height between 0.5 µm and 20 µm.

Step b) may comprise epitaxy of the semiconducting elements starting from a nucleation layer made of an electrically insulating material. Step c) may comprise removal of portions of the nucleation layer, so that at the end of step d), the first conductive studs are in contact with a lower surface of the semiconducting elements forming the lower face of the diodes.

Step b) may comprise epitaxy of the semiconducting elements starting from a nucleation layer made of a conductive or semiconducting material, the first conductive studs being, at the end of step d), in contact with a lower surface of the nucleation layer forming the lower face of the diodes.

Step b) may comprise depositing a conductive electrode layer, at least partially transparent, covering all the diodes, and in which a second conductive stud is in electrical contact with the electrode layer.

The second conductive stud may be located on the side of a so-called lower surface of the electrode layer oriented toward the lower face, or may be located on the side of a so-called upper surface of the electrode layer opposite the lower surface.

Step b) may comprise depositing a dielectric layer on the front face of the growth substrate or on a nucleation layer, one or more first conductive studs being in contact with the lower face of the diodes, and being electrically insulated from the electrode layer by the dielectric layer.

Each diode may comprise a three-dimensional semiconducting element.

The semiconducting material of the growth substrate may be silicon doped according to p-type or n-type conductivity.

BRIEF DESCRIPTION OF THE DRAWINGS

Other aspects, aims, advantages and features of the invention will become clearer on reading the following detailed description of preferred embodiments of the invention, given as nonlimiting examples, and referring to the appended drawings, where:

FIGS. 1A to 1C are schematic partial sectional views of an optoelectronic device for different steps of a method of fabrication leading to structural degradation of at least part of the optoelectronic device;

FIGS. 6A and 6B are schematic sectional views of variants of the optoelectronic device illustrated in FIG. 4C.

DETAILED ACCOUNT OF PARTICULAR EMBODIMENTS

Figure 2A:
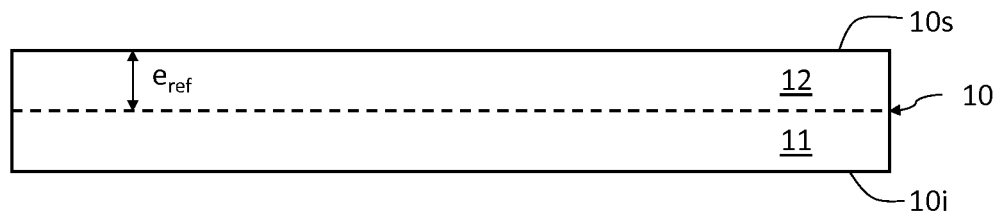
FIGS. 2A to 2G are schematic partial sectional views of an optoelectronic device for different steps of a method of fabrication according to a first embodiment.

In the figures and in the rest of the description, the same references represent identical or similar elements. Moreover, the different elements are not drawn to scale, to ensure clarity of the figures. Moreover, the different embodiments and variants are not exclusive of one another and may be combined with one another. Unless stated otherwise, the terms "approximately", "about", and "of the order of" signify to within 10%.

The invention relates to a method for fabricating an optoelectronic device 1 with diodes 20, which comprises a step of removing at least a portion of the substrate 10, over its entire thickness, on which the diodes 20 were resting initially.

As illustrated in FIGS. 1A to 1C, a method for fabricating an optoelectronic device 1 may lead to structural degradation of at least a part of the diodes 20. Said method may comprise:

forming a plurality of diodes 20, the diodes 20 being made for example from gallium nitride (GaN), starting from a front face 10s of a growth substrate 10, the latter being made for example of silicon;

depositing a dielectric layer 31 encapsulating all the diodes 20, and then fixing a retaining grip 32 on the encapsulating layer, here by means of a layer of glue 33;

removing at least a portion of the substrate 10 over its entire thickness so as to free a lower face 20i of the diodes 20, the portion removed being located initially opposite at least a part of the diodes 20;

optionally, forming at least one conductive stud (not shown) on the freed lower face 20i of the diodes 20.

Referring to FIG. 1A, it can be seen that, at the end of the step of fixing the grip 32, the stack formed from the growth substrate 10, the light-emitting diodes 20 and the grip 32 glued here to the encapsulating layer 31 by the layer of glue 33, may lead, at the level of the rear face 10i of the growth substrate 10, to flatness defects notably arising from inequalities of thickness in the XY plane of each of the layers of the stack. In this example, the flatness defect is reflected in a defect of parallelism between a plane passing through the rear face 10i of the growth substrate 10 and a plane passing through the upper face 32s of the grip 32.

Referring to FIG. 1B, the step of removing the portion of the growth substrate 10 may comprise a preliminary step of thinning the growth substrate 10 over its entire surface, for example by conventional grinding techniques, preserving a residual layer 10.1 of small thickness of the growth substrate 10. Removal of the substrate 10 may then be carried out by chemical etching of the residual layer 10.1. Grinding generally consists of fixing the grip 32 to a tool holder and then applying a rotating grinding tool to the rear face 10i of the substrate 10, following the arrows shown in FIG. 1B. It can be seen that at the end of the grinding step, the initial flatness defects are reflected in obtaining a residual layer 10.1 whose thickness has non-uniformities $\Delta e_{xy}$ in the XY plane. Thus, the residual layer 10.1 may have a thickness that varies locally between a maximum value $e_{max}$ and a minimum value $e_{min}$.

Referring to FIG. 1C, during removal of the residual layer 10.1 by chemical etching, possible over-etching of the light-emitting diodes 20 may occur in the zone with thickness $e_{min}$ as the etching time is essentially correlated with the maximum thickness $e_{max}$ of the residual layer 10.1 to be etched. This over-etching may lead to local structural degradation of the optoelectronic device 1 (hatched zone).

In the preceding example, the flatness defects are associated with the non-uniformities of thickness of the different layers forming the stack. However, the non-uniformities of thickness $\Delta e_{xy}$ of the residual layer 10.1 may also be due to a defect of parallelism between the tool holder and the grinding tool during the grinding step. Moreover, as a variant of or to supplement a grinding step, the thinning step may comprise carrying out chemical etching of the growth substrate 10 until the residual layer 10.1 to be etched is obtained. Thinning of the substrate 10 by chemical etching is also liable to lead to non-uniformities of thickness $\Delta e_{xy}$ of the residual layer 10.1, which may lead to structural degradation of the optoelectronic device 1.

To reduce the risks of structural degradation of the device 1, the method of fabrication according to the embodiments described hereunder specifies forming a growth substrate 10 made of a semiconductor material doped according to a first type of conductivity, of p-type or n-type, the substrate 10 comprising a so-called lower part 11 having a first doping level and a so-called upper part 12 having a second doping level lower than the first level, located between the lower part a and the front face 10s of the growth substrate 10. As described in detail later, since the upper part 12 has a uniform thickness $e_{ref}$ starting from the front face 10s, and by a step of selective chemical etching of the lower part 11 with respect to the upper part 12, the method makes it possible to obtain a residual layer 10.1 of constant thickness in the XY plane, which then makes it possible to fabricate an optoelectronic device 1 that is substantially protected from the possible degradation mentioned above.

Preferably, the optoelectronic device 1 comprises diodes 20 distributed spatially in a plurality of separate assemblies D of diodes 20, the assemblies D being polarizable independently of one another, thus forming separate pixels Px. The diodes 20 may be light-emitting and the optoelectronic device 1 may form a display screen or an image projection device.

The diodes 20 comprise semiconducting elements 21 which participate in the formation of a p-n junction of the diodes. In other words, each diode comprises a semiconductor junction formed of two semiconducting elements doped according to opposite types of conductivity. The junction may be of p-n type or p-i-n type.

According to one embodiment, the diodes 20 comprise three-dimensional semiconducting elements 21, which may have an elongated shape along a longitudinal axis, i.e. whose longitudinal dimension along the longitudinal axis is greater than the transverse dimensions. The three-dimensional elements are then called "wires", "nanowires" or "microwires". The transverse dimensions of the wires 21, i.e. their dimensions in a plane orthogonal to the longitudinal axis, may be between 10 nm and 10 µm, for example between 100 nm and 10 µm, and preferably between 100 nm and 5 µm. The height of the wires 21, i.e. their longitudinal dimension along the longitudinal axis, is greater than the transverse dimensions, for example 2 times, 5 times and preferably at least 10 times greater.

The cross section of the wires 21, in a plane orthogonal to the longitudinal axis, may have various shapes, for example a circular, oval, or polygonal shape, for example triangular, square, rectangular or even hexagonal. Here, the diameter is defined as being a quantity associated with the perimeter of the wire 21 at the level of a cross section. It may be the diameter of a disk having the same area as the cross section of the wire 21. The local diameter is the diameter of the wire 21 at a given height of the latter along the longitudinal axis. The average diameter is the mean, for example arithmetic mean, of the local diameters along the wire 21 or a portion of the latter.

In the rest of the description, the diodes 20 are light-emitting diodes 20 produced in so-called core/shell configuration, in the sense that the wire 21 is a first doped portion, for example n-type, which forms the core of the diode, which is surrounded by a shell 22 formed of an active zone and a second p-doped portion. Alternatively, the light-emitting diodes 20 may be made in an axial configuration in which the active zone and the second doped portion are located essentially in the prolongation of the wire 21, along the longitudinal axis, without surrounding the latter.

The wires 21 may be made of a crystalline material grown epitaxially from a nucleation surface, and the latter may be a surface of a growth substrate 10 or a surface of a nucleation layer or stud 23 made of a material different from that of the growth substrate 10. The material of the wires 21 comprises predominantly a first semiconductor compound that may be selected from the III-V compounds and in particular the III-N compounds, from the II-VI compounds or from the IV compounds or elements. For example, the III-V compounds may be compounds such as GaN, InGaN, AlGaN, AlN, InN or AlInGaN, or even compounds such as AsGa or InP. II-VI compounds may be CdTe, HgTe, CdHgTe, ZnO, ZnMgO, CdZnO, CdZnMgO. IV elements or compounds may be Si, C, Ge, SiC, SiGe, GeC. The wires 21 thus form the first portions of the diodes 20, and are doped according to one type of conductivity, here of the n-type. In this example, the wires are of GaN with n-type doping, notably with silicon. Here, they have an average diameter between 10 nm and 10 µm, for example between 100 nm and 5 µm and here it is approximately equal to 500 nm. The height of the wires 21 may be between 100 nm and 100 µm, for example between 500 nm and 50 µm, and here is approximately equal to 5 µm.

The active zone is the portion of the diode 20 at the level of which most of the light radiation from the diode 20 is emitted. It may comprise at least one quantum well made of a semiconductor compound having a forbidden band energy less than those of the wire and of the second doped portion. It may cover, in the core/shell configuration, the upper edge and the lateral edge of the wire 21. It may comprise a single quantum well or a plurality of quantum wells in the form of layers or dots inserted between barrier layers. Alternatively, the active zone need not comprise a quantum well. It may then have a forbidden band energy approximately equal to that of the wire and of the second doped portion. It may be made of a semiconductor compound that is not intentionally doped.

The second doped portion forms a layer which, in the core/shell configuration, covers and surrounds the active zone at least partly. It is made of a second semiconductor compound doped according to a type of conductivity opposite to that of the wire, i.e. here of p-type. The second semiconductor compound may be identical to the first semiconductor compound of the wire 21 or may comprise the first semiconductor compound as well as one or more additional alloying elements. In this example, the second doped portion may be GaN or InGaN, with p-type doping notably with magnesium. The thickness of the second doped portion may be between 20 nm and 500 nm, and may be equal to about 150 nm. Of course, the types of conductivity of the first and second portions may be reversed.

FIGS. 2A to 2G illustrate steps of a method for fabricating an optoelectronic device 1 according to a first embodiment, the optoelectronic device 1 advantageously comprising separate assemblies D of diodes 20, here light-emitting, produced by epitaxy starting from a growth substrate 10, the method comprising a step of removing at least portions of the growth substrate 10. Here, the optoelectronic device 1 forms a display screen or an image projection device.

Here, and for the rest of the description, a direct three-dimensional coordinate system (X,Y,Z) is defined, where the X and Y axes form a plane parallel to the principal plane along which the assemblies D of light-emitting diodes 20 extend, and where the Z axis is oriented approximately orthogonally to the principal plane. In the rest of the description, the terms "vertical" and "vertically" are to be understood as relating to an orientation approximately parallel to the Z axis, and the terms "horizontal" and "horizontally" as relating to an orientation approximately parallel to the XY plane. Moreover, the terms "lower" and "upper" are to be understood as relating to a positioning that increases along the +Z direction.

FIG. 2A illustrates a step of supplying a growth substrate 10 from which the light-emitting diodes 20 are produced. The growth substrate 10 is made of a monolithic semiconductor material, preferably crystalline and advantageously mono-crystalline. Preferably, the semiconductor material is silicon having a first type of conductivity, here of p-type, but the invention also applies to silicon with n-type doping. The growth substrate 10 has a front face 10s and a rear face 10i opposite one another. The front face 10s is the face of the substrate 10 from which the light-emitting diodes 20 are produced. The growth substrate 10 may have an initial thickness, i.e. before thinning and removal of portions, of for example between 200 µm and 1500 µm, preferably 725 µm.

First, a so-called lower part 11 is produced, having a first doping level, preferably uniform, i.e. approximately constant along the Z axis and in the XY plane. Preferably, the first doping level is such that the electrical resistivity of the lower part 11 is between 1 mΩ·cm and 50 mΩ·cm. Examples of doping elements are boron (B) and aluminum (Al). The lower part 11 extends continuously in the XY plane, and is intended to be opposite each assembly D of diodes 20. In this example, the lower part 11 is said to be p+ doped. "Opposite" generally means that the lower part is located plumb with, i.e. perpendicular to the assembly of diodes.

Next, a so-called upper part 12 is produced, having a second doping level lower than the first doping level, preferably uniform. Preferably, the second doping level is such that the electrical resistivity of the upper part 12 is between 1 Ω·cm and 100 Ω·cm. The upper part 12 also extends continuously in the XY plane, and is intended to be opposite each assembly D of diodes 20. It is located between the lower part 11 and the front face 10s, and flush with, i.e. opens onto, the front face 10s. It has a uniform thickness $e_{ref}$, i.e. the thickness of the upper part 12 measured starting from the front face 10s of the substrate 10 is constant in the XY plane. As an illustration, the thickness may be between about 0.5 µm and 20 µm. In this example, the upper part 12 is said to be p− doped. It may be produced by epitaxy starting from the p+ doped lower part 11.

Figure 2B:
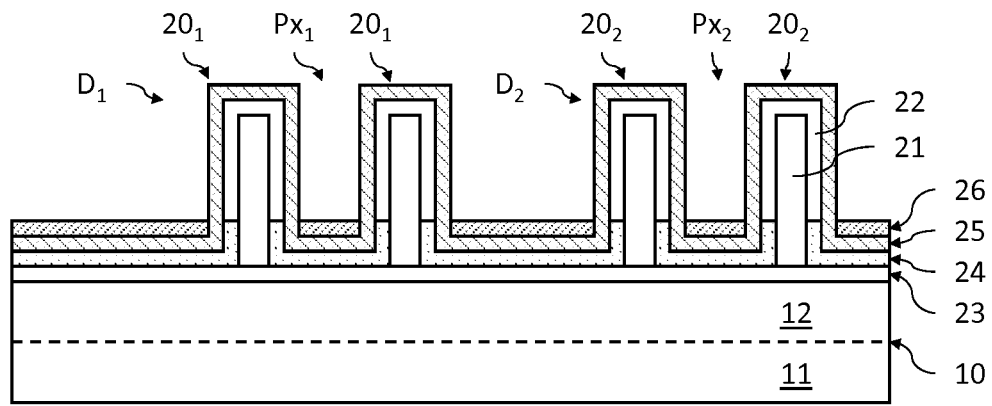

FIG. 2B illustrates the formation, on the front face 10s of the growth substrate 10, of a plurality of separate assemblies D of diodes 20, each diode 20 comprising a three-dimensional semiconducting element 21, called a wire hereinafter. Each assembly D of diodes 20 extends in the XY plane over a zone intended to form a pixel Px, which can be activated independently of the other pixels. A first assembly $D_1$ of first diodes $20_1$ and a second assembly $D_2$ of second diodes $20_2$ are shown here. The assemblies D of diodes 20 are located opposite the p− doped upper part 12 of the growth substrate 10, in the sense that each assembly D is located perpendicular to the p− doped upper part 12.

A nucleation layer 23 is deposited on and in contact with the front face 10s of the growth substrate 10, and in particular at the level of the zones P of the front face 10s intended to form the luminous pixels. This step, although optional, is advantageous since the layer 23 promotes nucleation of the wires 21. The nucleation layer 23 may be made of aluminum nitride (AlN), aluminum oxide (for example $Al_2O_3$), magnesium nitride ($Mg_xN_y$), nitride or carbide of a transition metal or of any other suitable material. The thickness of the nucleation layer 23 may be of the order of a few nanometers to some tens or hundreds of nanometers. In this example, the nucleation layer 23 is made of an electrically insulating material, for example of AlN. As a variant, as described later referring to FIG. 3A, the material may be electrically conducting. The nucleation layer 23 may be in the form of a continuous layer that covers the front face 10s, or in the form of a plurality of nucleation studs separate from one another, obtained for example by conventional steps of photolithography and etching of the nucleation layer 23.

Next, a dielectric layer 24 is deposited on the nucleation layer 23 to form a growth mask allowing localized epitaxial growth of the wires 21 starting from local openings on the nucleation layer 23. The dielectric layer 24 is made of an electrically insulating material such as, for example, a silicon oxide (for example $SiO_2$) or a silicon nitride (for example $Si_3N_4$), or even a silicon oxynitride. The thickness of the dielectric layer 24 may be between 5 nm and 800 nm, for example equal to about 30 nm.

The light-emitting diodes 20 are then produced, each comprising a three-dimensional semiconducting element 21, by epitaxial growth starting from the nucleation layer 23, for example by epitaxial growth by metal-organic chemical vapor deposition (MOCVD in English). The three-dimensional elements 21 are in this case wires, also called first doped portions, which extend from the nucleation layer 23 approximately perpendicularly to the Z axis. Each diode 20 further comprises a shell 22 comprising an active zone and a second doped portion, as well as a conductive electrode layer 25, in contact with the second doped portion of the shell 22. The wires 21, and in general the light-emitting diodes 20, may be formed by a method identical or similar to that described in application WO2012/136665, which is considered to form an integral part of the present description. Thus, the wires 21 are produced by epitaxial growth, and the shells 22 are each formed from the active zone and the second doped portion.

The second doped portion may further comprise an interposed electron blocking layer (not shown) located at the interface with the active zone. The electron blocking layer may in this case be formed of a III-N ternary compound, for example AlGaN or AlInN, advantageously p-doped. This makes it possible to increase the level of radiative recombinations in the active zone.

Then a so-called conductive electrode layer 25 is deposited, which in this case covers all the light-emitting diodes 20 of the different assemblies D. The electrode layer 25 is suitable for applying one and the same value of electrical polarization to the diodes 20 by means of a second conductive stud described later. It is made of a material that is at least partially transparent to the light emitted by the diodes 20, for example indium tin oxide (ITO in English) or ZnO, optionally doped (for example with gallium or aluminum). It can have a thickness of the order of a few nanometers to some tens or hundreds of nanometers, for example between 5 nm and 500 nm, preferably between 10 nm and 100 nm, for example equal to about 50 nm.

Then a so-called upper conductive layer 26 is deposited on the conductive electrode layer 25 in such a way that it does not cover the emissive surface formed by the shell 22 of the diodes 20. It is made of one or more conductive materials selected from aluminum, silver, gold, copper, ruthenium or any other suitable material, and has a thickness for example between 20 nm and 1500 nm, preferably between 400 nm and 800 nm. The conductive layer 26 makes it possible to reduce the electrical resistance, and thus improves the circulation of the electric current in the electrode layer 25.

Figure 2C:
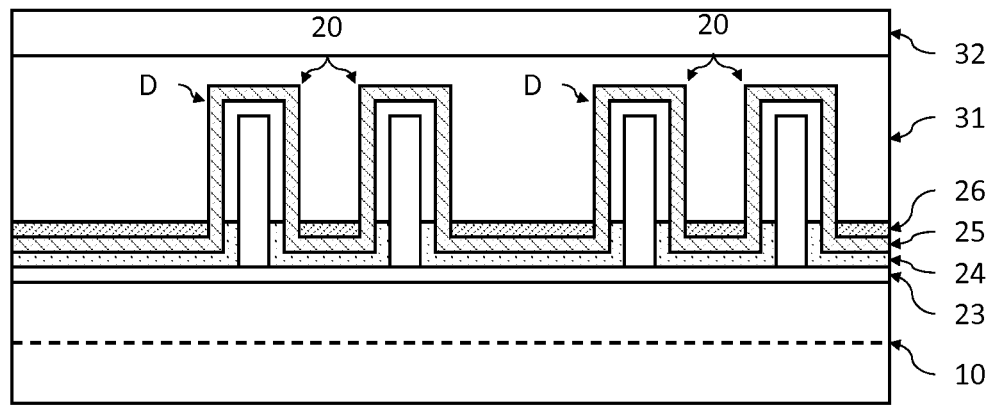

FIG. 2C illustrates a step of depositing an encapsulating layer 31 and then a step of fixing a grip 32, here by means of a layer of glue (not shown). The encapsulating layer 31 covers all the diodes 20 and in particular the electrode layer 25. It thus has a thickness between 250 nm and 50 μm. It is made of an electrically insulating material and is at least partially transparent to the radiation emitted by the diodes 20, for example a silicon oxide (e.g. $SiO_2$) or aluminum oxide (e.g. $Al_2O_3$), a silicon or aluminum nitride or other suitable inorganic material, or else a polymer of silicone, epoxide, or acrylic type or other suitable organic material. The encapsulating layer 31 may comprise phosphors suitable for converting at least part of the light emitted by the diodes 20 into light of another wavelength.

The grip 32 may be temporary or permanent. It may be made of a material that is at least partially transparent to the radiation emitted by the diodes 20, for example glass, or borosilicate glass or even Pyrex, or sapphire. The grip 32 may be fixed to the encapsulating layer 31 by gluing, for example using a glue that can be crosslinked by exposure to temperature or ultraviolet radiation, or even by molecular gluing.

Figure 2D:
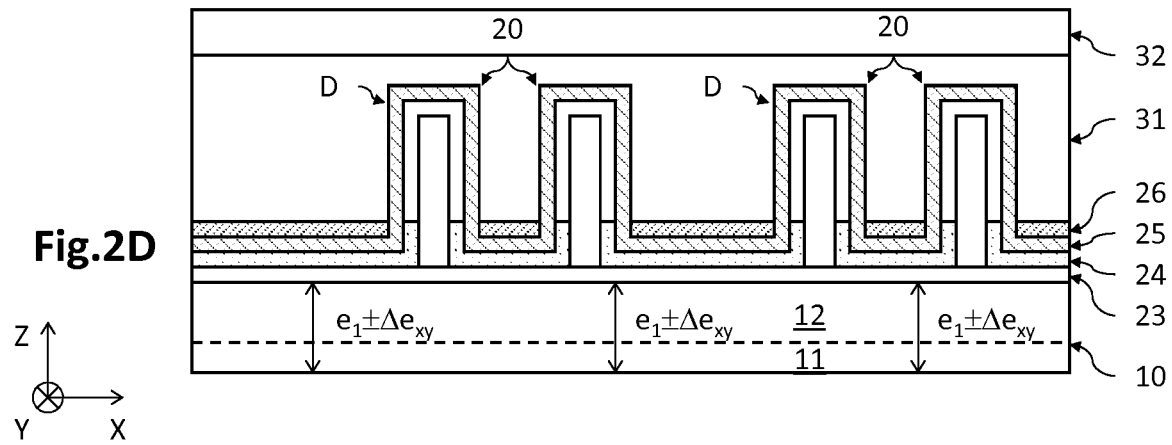

FIG. 2D illustrates a step of thinning the growth substrate 10 starting from the rear face 10i, so as to reduce the thickness of the p+ doped lower part 11. The local thickness of the p+ doped lower part 11 after thinning is still nonzero, so that the thickness $e_{ref}$ of the p− doped upper part 12 remains constant. Thinning may be carried out by a technique of wet or dry chemical etching, or by a grinding technique. As mentioned above, the thinned growth substrate 10 may have non-uniformities of thickness $\Delta e_{xy}$ in the XY plane, owing to for example to initial defect of parallelism of the stack formed of the growth substrate 10, the encapsulated plurality of diodes 20 and the grip 32, and/or owing to the mechanical or chemical thinning technique used. Thus, the thinned substrate 10 has a thickness $e_1$ which may vary locally between a maximum value $e_{max}$ and a minimum value $e_{min}$.

Figure 2E:
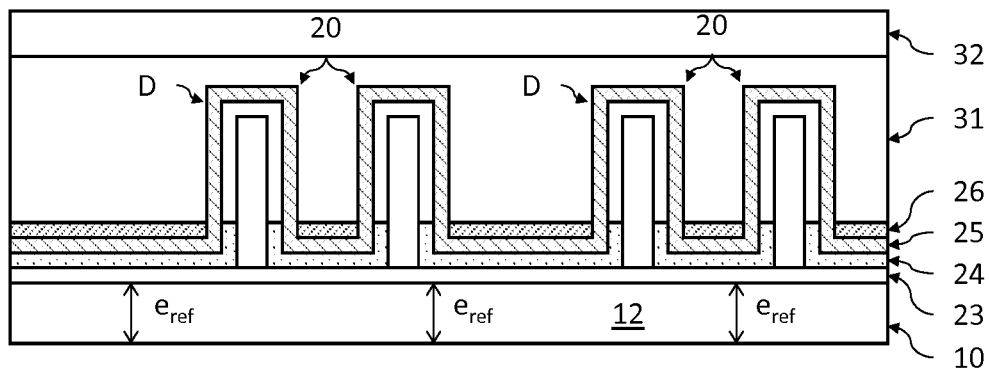

FIG. 2E illustrates removal of the p+ doped lower part 11 by selective chemical etching with respect to the p− doped upper part 12. The chemical etching may be wet or dry, and is in this case carried out wet using an etchant selected from one or more strong acids or weak acids, for example, among others, hydrofluoric acid (HF), nitric acid ($HNO_3$) or acetic acid ($CH_3$—CO—OH). In fact, such an etchant has a large difference in etching rate between the lower part 11 of heavily doped silicon and the upper part 12 of lightly doped silicon. Thus, the p+ doped lower part 11 is etched at least 50 times or even 100 times faster than the p− doped upper part 12, which is reflected in a certain selectivity of etching between the parts 11, 12. At the end of the step of removing the p+ doped lower part 11, the thinned substrate 10 only comprises the p− doped upper part 12, whose thickness $e_{ref}$ is constant in the XY plane. Thus, the non-uniformities of thickness of the growth substrate 10, connected with the initial defect of flatness and/or the step of mechanical or chemical thinning, have largely been removed.

Figure 2F:
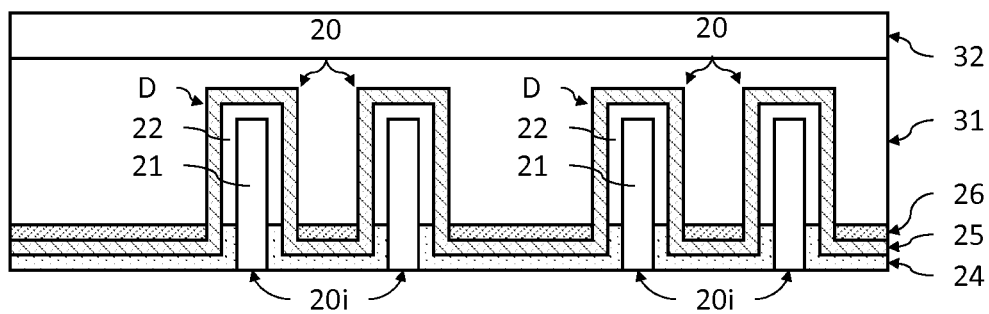

FIG. 2F illustrates removal of the p− doped upper part 12 by wet or dry chemical etching, selective with respect to, in this example, the nucleation layer 23. In this case the chemical etching is wet and the etchant may be selected from acids or bases, which may be, for example, tetramethylammonium hydroxide (TMAH) or potassium hydroxide (KOH). In this example the p− doped upper part 12 is removed completely. Thus, the lower surface of the nucleation layer 23 is left free, i.e. it is not covered with a material, and more precisely is no longer in contact with the material of the growth substrate 10.

In this example, the material of the nucleation layer 23 is electrically insulating. Thus, removal of the nucleation layer 23 is also undertaken, either complete in the XY plane, or partial in a localized manner in the XY plane, for example in the zones of the assemblies D of diodes 20. In this example, the nucleation layer 23 is removed completely, in this case by wet or dry chemical etching, selective with respect to the material of the wire 21 and the material of the dielectric layer 24. Thus, this frees the lower face 20i of the diodes 20, formed in this case by the lower surface of the wires 21. The lower face of a diode 20 is the face of the diode 20 with respect to which the wire 21 is in electrical contact. It may correspond to the lower surface of the wire 21 or a lower surface of a nucleation layer in a conductive or semiconducting material from which the wire was grown epitaxially.

Figure 2G:
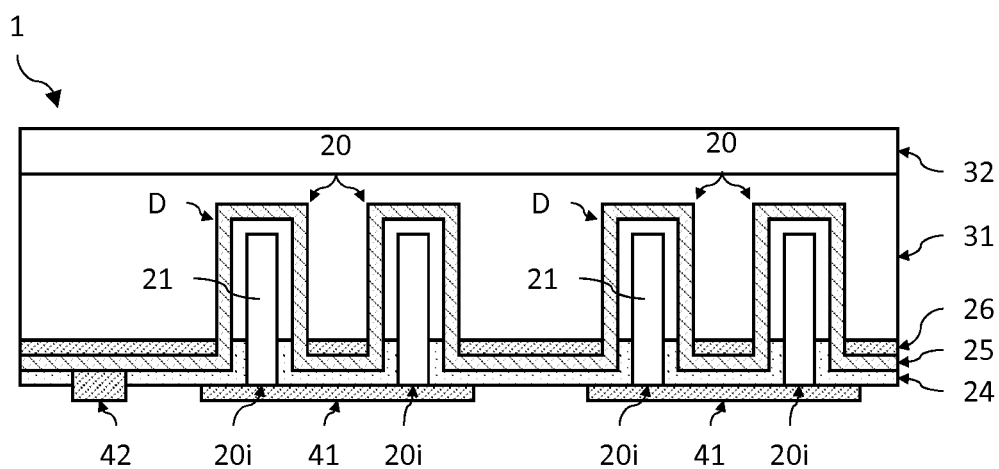

FIG. 2G illustrates the formation of a plurality of first conductive studs 41, each conductive stud 41 being deposited opposite a different assembly D of diodes 20, and in contact with the lower face 20i of the diodes 20 of the assembly D in question. Each conductive stud 41 is made of one or more conductive materials selected so as to ensure ohmic contact with the lower face 20s of the diodes 20, for example a stack of the type Ti/Al/Ni/Au in the case of wires of GaN, or any other suitable material, and has a thickness for example between 1 μm and 10 μm, for example about 5 μm. A second conductive stud 42 is located at the edge of the assemblies D of diodes 20, and is in contact with the electrode layer 25 via a through-hole made in the dielectric layer 24.

Thus, an optoelectronic device 1 is obtained whose structure has been preserved during the fabrication process by the fact that any non-uniformities of thickness $\Delta e_{xy}$ introduced into the growth substrate m were removed during the selective chemical etching of the p+ doped lower part 11, giving a residual growth layer of constant thickness $e_{ref}$ formed by the p− doped upper part 12.

Moreover, in this case the optoelectronic device 1 has reduced heat resistance, since the growth substrate m has been removed completely, which improves abstraction of the heat produced by the device 1 in operation. Moreover, in this example, the optoelectronic device 1 has mechanical durability provided essentially by the thickness of the encapsulating layer 31 combined with the thickness of the transparent grip 32. As a variant, the grip may be temporary and may be removed in a subsequent step of the fabrication process. The mechanical durability of the optoelectronic device 1 may then be provided essentially by the thickness of the encapsulating layer 31 and preferably by a control chip hybridized to the optoelectronic device.

The arrangement of the various conductive studs 41, 42 makes it possible to fix the optoelectronic device 1 to a control chip (not shown) suitable for polarizing the different assemblies D of diodes 20 independently of one another. Fixation between the conductive studs 41, 42 and the control chip may be carried out by means of beads of a fusible material, for example indium, SnAg, by studs of copper or gold, or even by molecular bonding of the copper/copper type, or by any other hybridization technique.

Figure 3A:
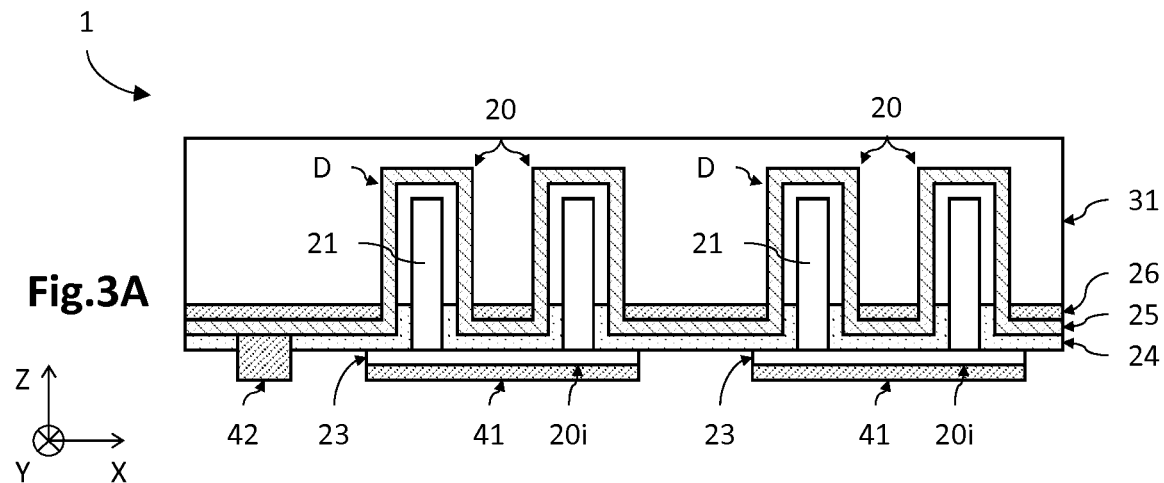
FIGS. 3A and 3B are schematic sectional and top views, respectively, of a variant of the optoelectronic device illustrated in FIG. 2G.

FIG. 3A illustrates a variant of the optoelectronic device 1 illustrated in FIG. 2G, which differs therefrom essentially in that the grip 32 has been removed and in that a nucleation portion 23, derived from the nucleation layer, is preserved at the level of each assembly D of diodes 20, the nucleation material then being conductive or semiconducting. In this variant, the nucleation material is both suitable for promoting nucleation of the wires 21 and for allowing injection of the charge carriers in the wires 21. The nucleation material may comprise a transition metal. It may be selected from titanium, vanadium, chromium, zirconium, niobium, molybdenum, hafnium, tantalum and tungsten, or a nitride or carbide of a transition metal, for example of titanium, zirconium, hafnium, vanadium, niobium, tantalum, chromium, molybdenum, tantalum, or a combination of these compounds. The transition metals, and their nitrides and carbides, offer the advantages of allowing nucleation of the wires and of having electrical conductivity close to that of the metals.

Preferably, each nucleation portion 23 may have a structure similar or identical to that described in application FR16/56008 filed on 28 Jun. 2016, which is considered to form an integral part of the present description. Thus, the nucleation portion 23 may comprise an upper sublayer of a material comprising a transition metal grown epitaxially from a lower sublayer of a crystalline material, the latter having been grown epitaxially from, for example, the surface of the growth substrate 10.

Figure 3B:
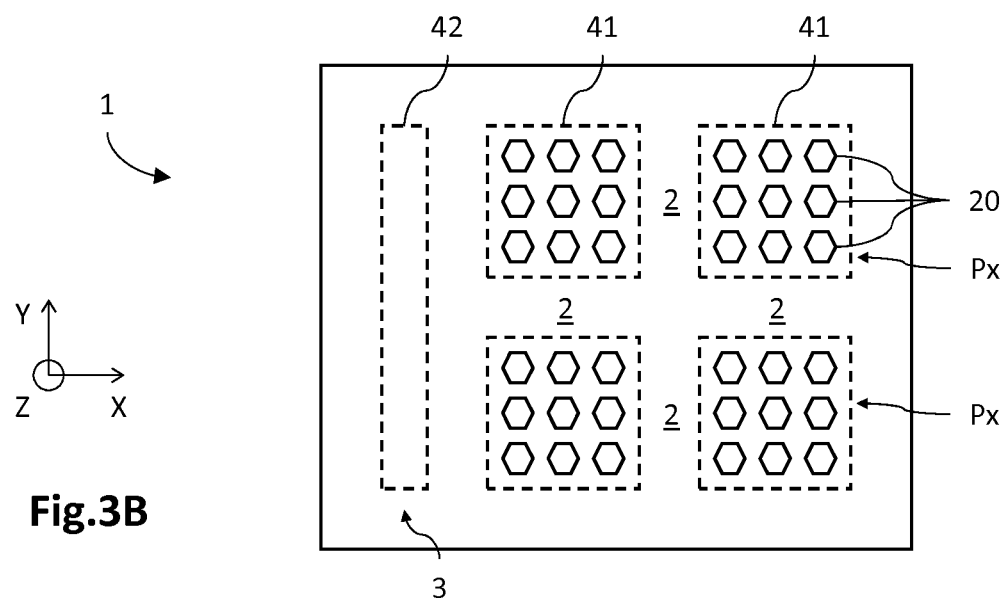

FIG. 3B is a top view of the optoelectronic device 1 illustrated in FIG. 2G or FIG. 3A. Each assembly D of diodes 20 forms a pixel Px of the optoelectronic device 1. The assemblies D of diodes 20 are separated from one another in the XY plane by an interposed edge 2 not in electrical contact with either of the first conductive studs 41 (shown with a dotted line). The optoelectronic device 1 comprises a lateral edge 3 with respect to assemblies D of diodes 20, at the level of which the second conductive stud 42 is located.

Figure 3C:
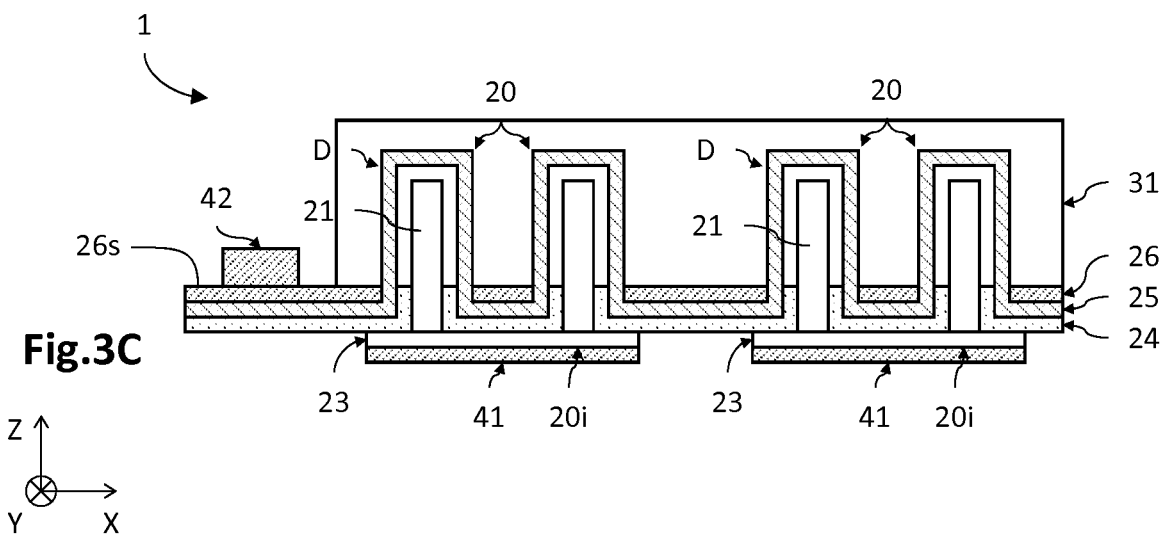
FIG. 3C is a schematic sectional view of a variant of the device illustrated in FIG. 3A.

FIG. 3C illustrates a variant of the optoelectronic device 1 illustrated in FIG. 3A, which differs therefrom essentially in that the second conductive stud 42 rests on the upper face 26s of the conductive layer 26, and is thus in electrical contact with the electrode layer 25. As a variant, the conductive layer 26 might not extend onto the electrode layer 25 in this zone, so that the second conductive stud 42 is directly in contact with the electrode layer 25.

Figure 4A:
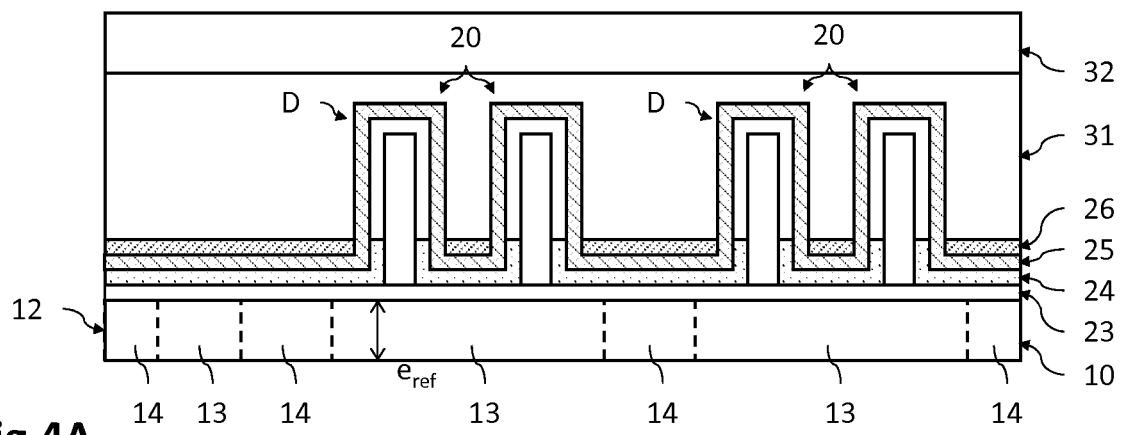
FIGS. 4A to 4C are schematic partial sectional views of an optoelectronic device for different steps of a method of fabrication according to a second embodiment.
Figure 4B:
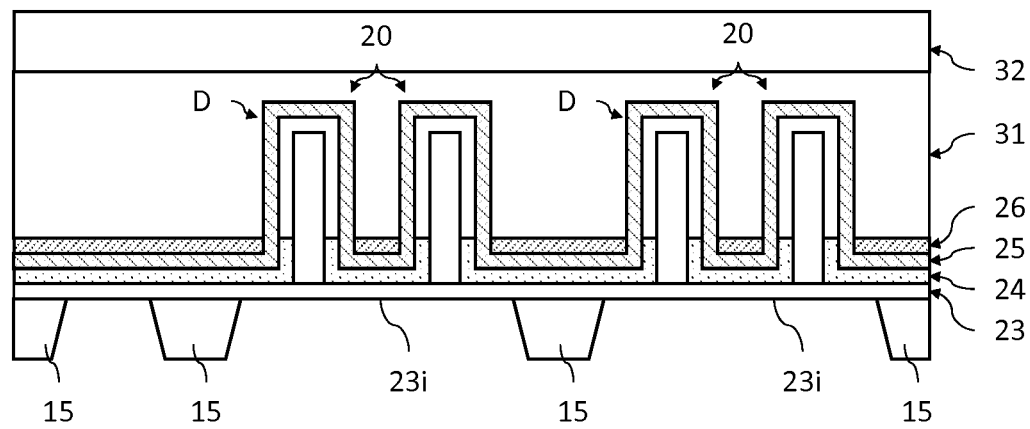
Figure 4C:
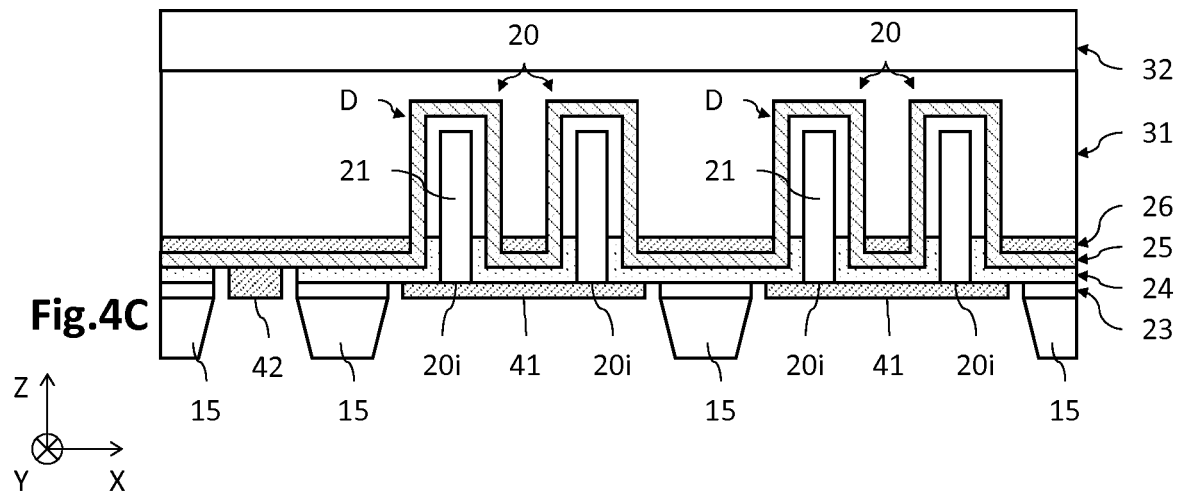

FIGS. 4A to 4C illustrate certain steps of a method for fabricating an optoelectronic device 1 according to a second embodiment. This method of fabrication differs from that described with reference to FIG. 2A to 2G essentially in that it comprises the formation of retaining side walls 15 by localized etching of portions of the p− doped upper part 12 of the growth substrate 10. The retaining side walls 15 notably make it possible to reinforce the mechanical durability of the optoelectronic device 1, while allowing pixelization of the diodes 20, and may also comprise electronic functions.

The initial steps of the method according to this embodiment are identical to those described with reference to FIG. 2A to 2E and are not described again.

FIG. 4A illustrates the optoelectronic device 1 obtained at the end of the step of removing the p+ doped lower part 11 by selective chemical etching with respect to the p− doped upper part 12, as mentioned above with reference to FIG. 2E. Thus, any non-uniformities of thickness $\Delta e_{xy}$ of the growth substrate m after the preliminary thinning step are removed, which makes it possible to reduce the risks of structural degradation of the optoelectronic device 1.

FIG. 4B illustrates a step of forming retaining side walls 15, by localized chemical etching of so-called central portions 13 of the p− doped upper part 12, so as to preserve so-called lateral portions 14, which then form the retaining side walls 15.

Each central portion 13 removed is located initially opposite an assembly D of diodes 20, i.e. each diode 20 of the assembly D considered is located on the perpendicular of a central portion 13. The central portions 13 are separate from one another and are separated in pairs by a lateral portion 14. Thus, it will be understood that the lateral portions 14 are located between two adjacent assemblies D of diodes 20, i.e. located opposite the interposed edge 2 delimiting two adjacent assemblies D.

The central portions 13 are removed by conventional steps of photolithography and chemical etching of the zones forming the central portions 13. The latter have a doping level identical to that of the p− doped upper part 12. They are etched by wet etching, for example in a basic medium (e.g. KOH or TMAH), or by plasma dry etching (RIE, ICP, etc.) selective with respect to the nucleation layer 23 if applicable (as illustrated in FIG. 4B), or with respect to the wires 21 and the dielectric layer 24.

The unetched lateral portions 14 then form retaining side walls 15, with average height approximately equal to the initial thickness $e_{ref}$ of the p− doped lateral portions 14. Thus, the thickness of lateral portions 14 preferably being between 0.5 μm and 20 μm, the retaining side walls 15 have a height approximately equal to this initial thickness. The side walls 15 preferably form a continuous grid that surrounds each assembly D of diodes 20, for example in the form of a honeycomb, where each through-hole of the grid corresponds to a pixel Px of the optoelectronic device 1.

In this example, as the nucleation layer 23 is made of an electrically insulating material, localized etching of the nucleation layer 23 is carried out to free the lower face 20i of the diodes 20 with respect to which the wires 21 are in electrical contact.

FIG. 4C illustrates formation of the first conductive studs 41, each first conductive stud 41 being deposited opposite a different assembly D of diodes 20. The first conductive studs 41 are separated in pairs, in the XY plane, by a retaining side wall 15. In this example, formation of a second conductive stud 42 is envisaged, located on a lateral edge 3 of the optoelectronic device 1, which is in contact with the electrode layer 25 via a through-hole made in the dielectric layer 24.

The retaining side walls 15 may be functionalized and thus comprise active or passive electronic circuits, connected to some or all of the assemblies D of diodes 20. The electronic circuits may thus form ESD protection, for example by comprising Zener diodes, or even have electronic functions of monitoring or controlling the electric circuit for polarization of the assemblies D of diodes. Besides Zener diodes, Schottky diodes or transistors of the MOS type may notably be located in the retaining side walls 15.

Thus, this method according to this second embodiment makes it possible to limit structural degradation of the optoelectronic device 1 by eliminating the non-uniformities of thickness $\Delta e_{xy}$ introduced in the growth substrate 10 on account of the initial defects of flatness or even by the thinning techniques used. A residual layer of constant thickness $e_{ref}$ formed by the upper part 12 is thus obtained. It additionally makes it possible to produce the retaining side walls 15, which can reinforce the mechanical durability of the optoelectronic device 1. Moreover, the fact that the side walls have an average height roughly identical from one side wall 15 to the next, the spatial distribution of the mechanical stresses is itself approximately uniform within the optoelectronic device 1, making it possible to limit the zones of stress concentration and thus further improve the mechanical durability of the optoelectronic device. Moreover, this method makes it possible to obtain a continuous grid whose through-holes, delimited by the lateral retaining walls, are located at the level of the assemblies D of diodes 20, which allows pixelization of the diodes 20 by formation of the first conductive studs 41 via the through-holes.

FIGS. 5A to 5F illustrate steps of a method for fabricating an optoelectronic device 1 according to a third embodiment. This method of fabrication differs from that described with reference to FIG. 4A to 4C essentially in that the central portions 13 are formed beforehand during the step of supplying the growth substrate 10, by localized doping of the p− doped upper part 12 so as to obtain p+ doped chambers 13 located in the p− doped upper part 12.

Figure 5A:
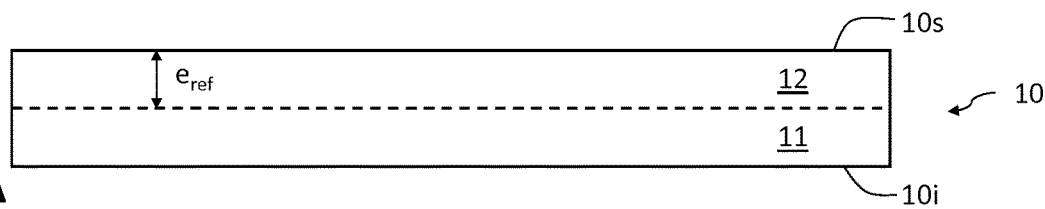
FIGS. 5A to 5G are schematic partial sectional views of an optoelectronic device for different steps of a method of fabrication according to a third embodiment.
Figure 5B:
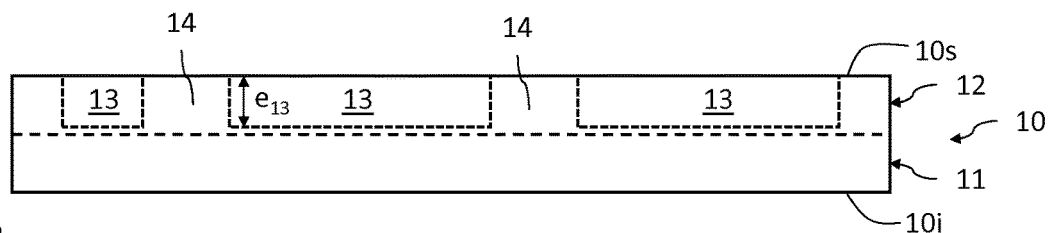

FIGS. 5A and 5B illustrate supplying a growth substrate 10 made of a semiconductor material, preferably crystalline silicon, doped according to one and the same type of conductivity, here of p-type. Referring to FIG. 5A, a so-called p+ doped lower part 11 and a so-called p− doped upper part 12 are formed in the substrate 10. This step is similar or identical to the steps described with reference to FIG. 2A and is not described again. The p− doped upper part 12 has a constant thickness $e_{ref}$ in the XY plane.

Referring to FIG. 5B, so-called central portions 13 and so-called lateral portions 14 are then produced in the p− doped upper part 12. The central portions 13 are produced by localized doping of the p− doped upper part 12, i.e. by localized insertion of a dopant in the upper part 12, by ion implantation or by thermal diffusion, so as to obtain separate portions 13, doped according to the first type of conductivity, here of p-type, with a doping level approximately equal to, or even greater than, the first doping level. Thus, the central portions 13 are said to be of the p+ doped type, just like the lower part u. The thickness $e_{13}$ of the p+ doped central portions 13 is in this case strictly less than the thickness $e_{ref}$ of the p− lower part, so that each p+ central portion is separate from the p+ doped lower part 11 by a spatial discontinuity of the doping level along the Z axis.

The lateral portions 14 correspond to zones of the p− doped upper part 12 whose doping level has not been altered. They therefore have a doping level equal to the second doping level and are said to be p− doped. The thickness of the lateral portions is roughly constant and is equal to the thickness $e_{ref}$ of the upper part. The lateral portions 14 are in contact with one another so as to form a spatial continuity of the doping level, in the XY plane, which surrounds each central portion 13.

Figure 5C:
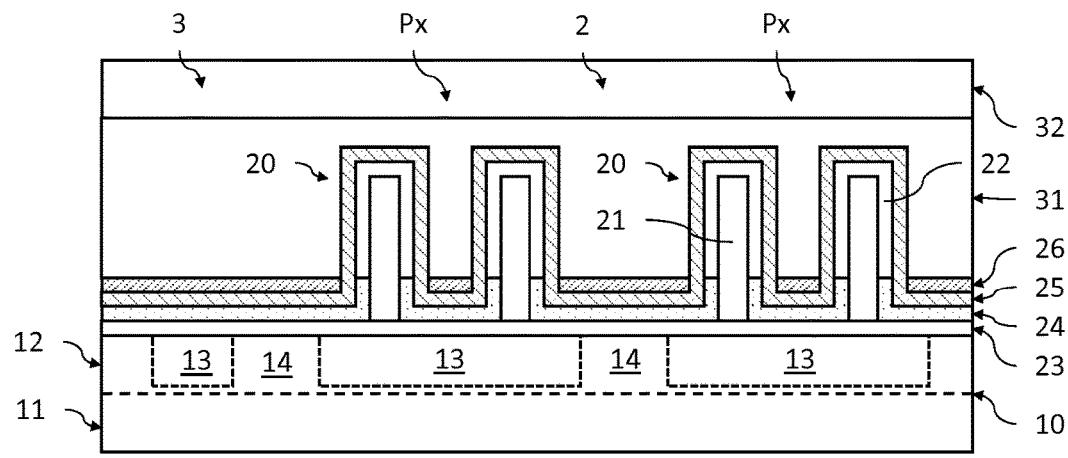

FIG. 5C illustrates the formation, on the front face 10s of the growth substrate 10, of a plurality of separate assemblies D of diodes 20. This step is similar or identical to that described with reference to FIG. 2B and is not described in detail again. Each assembly D of diodes 20 is opposite a p+ doped central portion 13, the p− doped lateral portions 14 being located opposite an interposed edge 2 separating two adjacent assemblies D.

Next, deposition of the layer 31 encapsulating all the diodes 20 and then fixation of a grip 32 are carried out. This step is similar or identical to that described with reference to FIG. 2C and is not described in detail again.

Figure 5D:
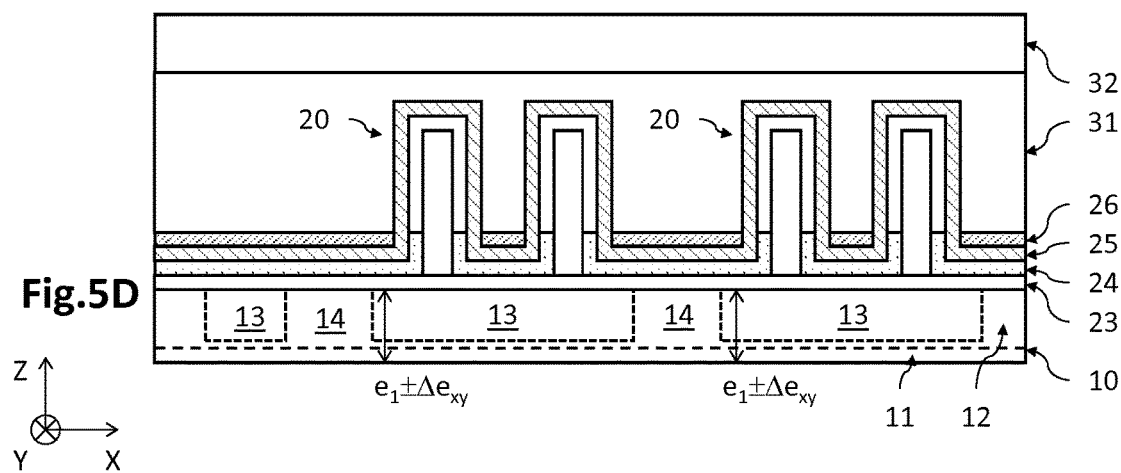

FIG. 5D then illustrates a first phase of thinning the growth substrate m starting from the rear face 10i, by wet or dry chemical etching, or by grinding, so as to reduce the thickness of the p+ doped lower part 11. As described above referring to FIG. 2D, the p+ doped lower part 11 is not removed over its entire thickness, so that the thinned substrate 10 has a nonzero thickness $e_1$ in the XY plane, greater than the thickness $e_{ref}$ of the p− doped upper part 12. However, the thinned substrate 10 is now liable to have non-uniformities of thickness $\Delta e_{xy}$ owing to an initial defect of parallelism or even owing to the mechanical or chemical thinning technique used. The thinned substrate m thus has a thickness $e_1$ which may vary locally between a maximum value $e_{max}$ and a minimum value $e_{min}$.

Figure 5E:
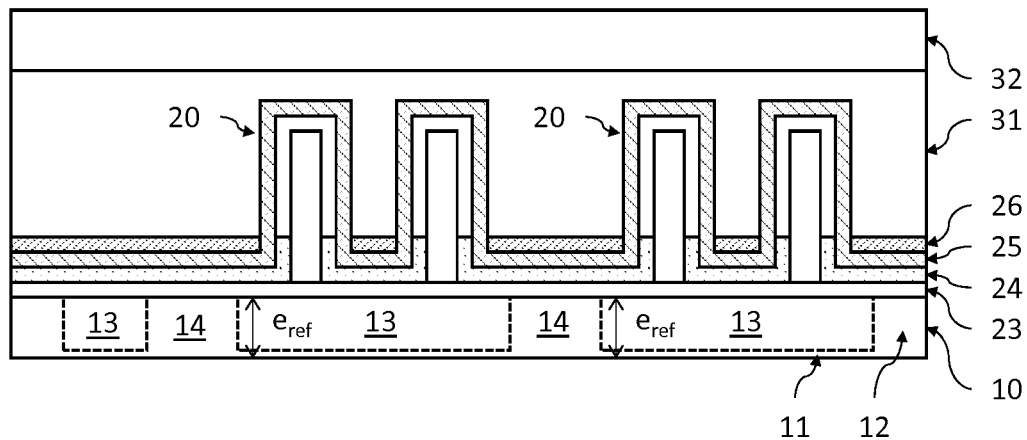

FIG. 5E illustrates removal of the p+ doped lower part 11 by selective chemical etching with respect to the p− doped lateral portions. As described above, chemical etching may be wet or dry, and is in this case carried out wet using an etchant selected from one or more strong acids and/or one or more weak acids. Since this etchant has a large difference in etching rate between the p+ doped lower part 11 and the p− doped upper part 12, for example with a ratio of 50, or even a ratio of 100, only the p+ doped lower part 11 is removed, not the p− doped upper part 12. Moreover, since there is a spatial discontinuity of the doping level along the Z axis between the p+ doped lower part 11 and the p+ doped central portions 13, the p+ doped central portions 13 are not etched. At the end of this step, the thinned growth substrate 10 has a constant thickness $e_{ref}$ in the XY plane, the latter being strictly greater than the thickness $e_{13}$ of the p+ doped central portions 13.

Figure 5F:
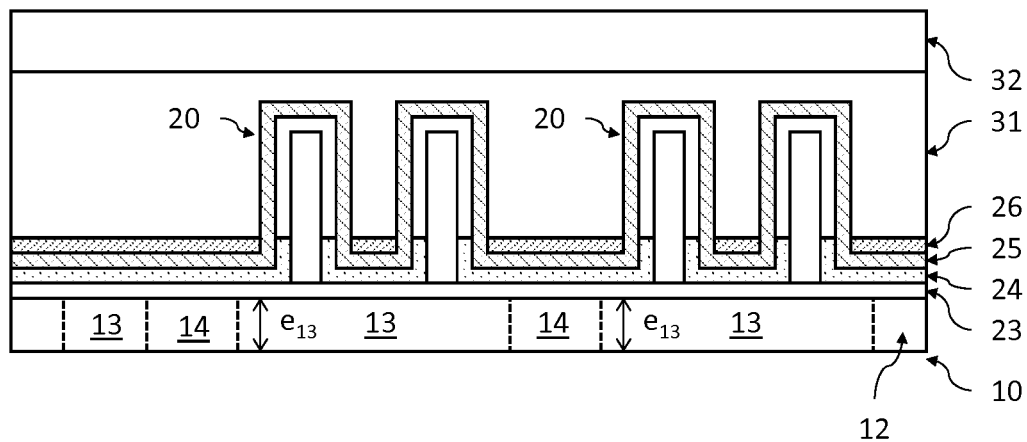

FIG. 5F illustrates a second phase of thinning the growth substrate 10, allowing the rear face 10i of the substrate 10 to open out onto the p+ doped central portions 13. This thinning phase may be carried out by a nonselective wet or dry chemical etching technique, or by a grinding technique. Since there is a small difference between the thickness $e_{13}$ of the p+ doped central portions 13 and the thickness $e_{ref}$ of the p− doped upper part 12, for example of the order of a micron to a few microns, for example about 1 μm, this second thinning phase is not likely to introduce substantial non-uniformities of thickness $\Delta e_{xy}$ in the thinned growth substrate 10.

Figure 5G:
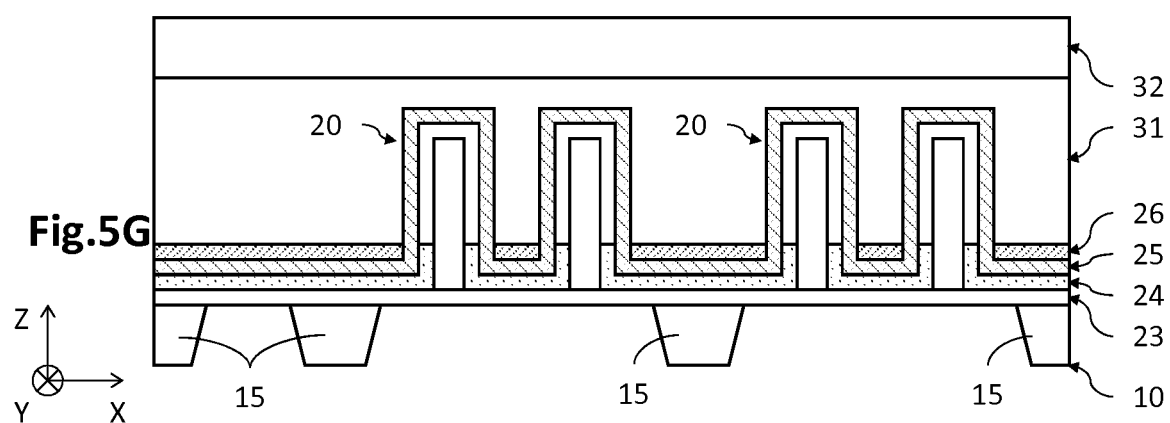

FIG. 5G illustrates removal of the p+ doped central portions 13 by selective chemical etching with respect to the p− doped lateral portions 14 and in this case with respect to the nucleation layer 23. The etchant may be identical or similar to that used with reference to FIG. 5E. Thus, the p+ doped central portions 13 are etched on their entire thickness, so as to free the lower surface of the nucleation layer 23. Retaining side walls 15 similar or identical to those described previously are thus obtained.

The following steps of the method of fabrication are identical or similar to those described with reference to FIGS. 4B and 4C, and are not described again.

Thus, like the method according to the first and second embodiments, the method according to this third embodiment makes it possible, besides limiting the structural degradation of the optoelectronic device 1 by obtaining a thinned growth substrate 10 making it possible to limit the non-uniformities of thickness $\Delta e_{xy}$, to form the retaining side walls 15 by selective chemical etching of the p+ doped central portions 13.

FIGS. 6A and 6B illustrate two variants of the optoelectronic device 1 illustrated in FIG. 4G. The variant shown in FIG. 6A differs essentially in that the grip 32 has been removed and in that nucleation portions 23, derived from the nucleation layer, are preserved, the nucleation material being conductive or semiconducting. As described above with reference to FIG. 3A, the nucleation material may comprise a transition metal, and the nucleation portion may have a structure similar or identical to that described in application FR16/56008. Moreover, the variant shown in FIG. 6B differs from the optoelectronic device 1 in FIG. 6A essentially in that the second conductive stud 42 rests on the conductive layer 26 and is thus in electrical contact with the electrode layer 25.

Particular embodiments have been described. Different variants and modifications will be apparent to a person skilled in the art.

Thus, various examples have been described of an optoelectronic device 1 with light-emitting diodes 20 obtained by the method of fabrication, the optoelectronic device 1 advantageously forming a display screen or an image projector. However, the invention also applies to the field of photodiodes 20 for receiving and detecting incident light and converting it into electrical signals.

Diodes 20 of the wire type have been described, but the invention also applies to three-dimensional semiconducting elements in the form of three-dimensional studs whose height along the Z axis is of the same order of magnitude as their transverse dimensions in the XY plane, as well as to three-dimensional elements in the form of pyramids, optionally truncated. It also applies to diodes with a mesa structure. "Mesa structure" means a structure formed of a stack of semiconducting portions, forming a p-n junction, located projecting above the growth substrate at the end of an etching step.

A growth substrate made of a semiconductor material with p-type doping has also been described, but the invention also applies to semiconductor material, for example silicon, with n-type doping. In this case, the lower part 11 is n+ doped and the upper part 12 is n– doped. In the context of the third embodiment of the method of fabrication, the central portions 13 may be n+ doped.

The invention claimed is:

1. A method for fabricating an optoelectronic device, said method comprising a executing a first step, executing a second step, and executing a third step, wherein said first step comprises supplying a growth substrate made of a semiconductor material, wherein said semiconductor material comprises a front face and a rear face, wherein said front face and said rear face are opposite one another, wherein said second step comprises forming diodes on said front face, wherein each diode comprises a lower face that rests on said growth substrate, and wherein said third step comprises removing, from said rear face, at least one portion of said growth substrate so as to free said lower face of at least a part of said diodes, wherein removing at least one portion comprises removing a portion that was initially located opposite said part of said diodes, wherein said first step further comprises producing a lower part and an upper part of said growth substrate, each extending opposite said diodes, wherein said upper and lower parts are doped according to one and said same type of conductivity, wherein said lower part has a first doping level, wherein said upper part has a second doping level that is lower than said first doping level and extends from said front face to said lower part with a uniform thickness, and wherein said third step further comprises removing said lower part by selective chemical etching with respect to said upper part.

2. The method of claim 1, wherein said third step further comprises causing complete removal of said upper part of said growth substrate by chemical etching in a plane parallel to said front face so as to free said lower face of said diodes.

3. The method of claim 1, wherein said third step further comprises causing partial removal of said upper part of said growth substrate by chemical etching in a plane parallel to said front face so as to free said lower face of said diodes.

4. The method of claim 1, wherein each diode comprises a semiconducting element that participates in forming a p-n junction of said diode, wherein said lower face of each diode is in electrical contact with said semiconducting element, wherein said method further comprises executing a fourth step, wherein said fourth step comprises forming at least one first conductive stud in contact with said lower face of said part of said diodes.

5. The method of claim 1, wherein said second step comprises depositing a conductive electrode layer, at least partially transparent, covering all of said diodes, and wherein a second conductive stud is in electrical contact with said electrode layer.

6. The method of claim 5, wherein said second conductive stud is located on said side of a lower surface of said electrode layer oriented toward said lower face.

7. The method of claim 5, wherein said second conductive stud is located on said side of an upper surface of said electrode layer opposite said lower surface.

8. The method of claim 1, wherein said second step further comprises depositing a dielectric layer on said front face of said growth substrate, wherein one or more first conductive studs is in contact with said lower face of said diodes, and wherein one or more conductive studs is electrically insulated from said electrode layer by said dielectric layer.

9. The method of claim 1, wherein said second step further comprises depositing a dielectric layer on a nucleation layer, wherein one or more first conductive studs is in contact with said lower face of said diodes, and wherein one or more conductive studs is electrically insulated from said electrode layer by said dielectric layer.

10. The method of claim 1, further comprising causing each diode to be a three-dimensional semiconducting element.

11. The method of claim 1, in which said semiconducting material of said growth substrate comprises p-doped silicon.

12. The method of claim 1, wherein said semiconducting material of said growth substrate comprises n-doped silicon.

13. The method of claim 4, wherein, in said second step, said diodes are distributed spatially as a plurality of separate assemblies of diodes, wherein each assembly is intended to form a pixel of said optoelectronic device and wherein, in said fourth step, a plurality of separate first conductive studs is formed, wherein each first conductive stud is in contact with said lower face of said diodes of one and said same assembly.

14. The method of claim 13, wherein said upper part comprises central portions separated from one another, in a plane parallel to said front face, by lateral portions, each central portion being located opposite an assembly of diodes and wherein said lateral portions are located between said assemblies of diodes and wherein said third step further comprises partial removal of said upper part, in a plane parallel to said front face, so as to remove said central portions and preserve said lateral portions, which thus form retaining side walls.

15. The method of claim 13, wherein said second step further comprises causing epitaxy of said semiconducting elements starting from a nucleation layer made of an electrically insulating material and said third step further comprises removing portions of said nucleation layer, so that at, upon completion of said fourth step, said first conductive studs are in contact with a lower surface of said semiconducting elements forming said lower face of said diodes.

16. The method of claim 13, wherein said second step comprises causing epitaxy of said semiconducting elements starting from a nucleation layer made of a conductive or semiconducting material, said first conductive studs being, upon completion of said fourth step, in contact with a lower surface of said nucleation layer forming said lower face of said diodes.

17. The method of claim 14, wherein said third step further comprises wet etching said central portions.

18. The method of claim 14, wherein said third step further comprises dry etching said central portions.

19. The method of claim 14, wherein said first step further comprises producing said central portions by localized doping of said upper part in such a way that said central portions have a doping level greater than or equal to said first doping level and so that said lateral portions have said second doping level, each central portion being separated from said adjacent central portions by one of said lateral portions, and each central portion having a thickness that is less than said thickness of said upper part and wherein said third step further comprises, following removal of said lower part, thinning said growth substrate so that said rear face opens onto said central portions, then removing said central portions by selective chemical etching with respect to said lateral portions, so as to free said lower face of said assemblies of diodes, said lateral portions thus forming retaining side walls.

20. The method of claim 14, further comprising causing said thickness of said upper part to be between 0.5 µm and 20 µm, so that, at said end of said third step, said retaining side walls have a height between 0.5 µm and 20 µm.

* * * * *